(12) United States Patent
Tanaka

(10) Patent No.: US 7,622,978 B2
(45) Date of Patent: Nov. 24, 2009

(54) DATA HOLDING CIRCUIT AND SIGNAL PROCESSING CIRCUIT

(75) Inventor: Yuji Tanaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 216 days.

(21) Appl. No.: 11/951,893

(22) Filed: Dec. 6, 2007

(65) Prior Publication Data

US 2008/0211559 A1 Sep. 4, 2008

(30) Foreign Application Priority Data

Dec. 8, 2006 (JP) .............................. 2006-332681

(51) Int. Cl.
*H03K 3/037* (2006.01)

(52) U.S. Cl. ....................................... 327/225; 327/219

(58) Field of Classification Search ................. 327/199, 327/208, 212, 219, 225
See application file for complete search history.

(56) References Cited

U.S. PATENT DOCUMENTS 5,880,613 A * 3/1999 Ishihara ...................... 327/202
6,204,707 B1 * 3/2001 Hamada et al. ............. 327/202
7,446,581 B2 * 11/2008 Ishii et al. ................... 327/210

FOREIGN PATENT DOCUMENTS

JP          4-105415 A      4/1992

* cited by examiner

*Primary Examiner*—Hai L Nguyen
(74) *Attorney, Agent, or Firm*—Birch, Stewart, Kolasch & Birch LLP

(57) ABSTRACT

A data holding circuit is capable of latching an input signal at both a rising edge and a falling edge of a clock signal. Several flip-flops and exclusive OR circuits cooperate to achieve this function.

13 Claims, 13 Drawing Sheets

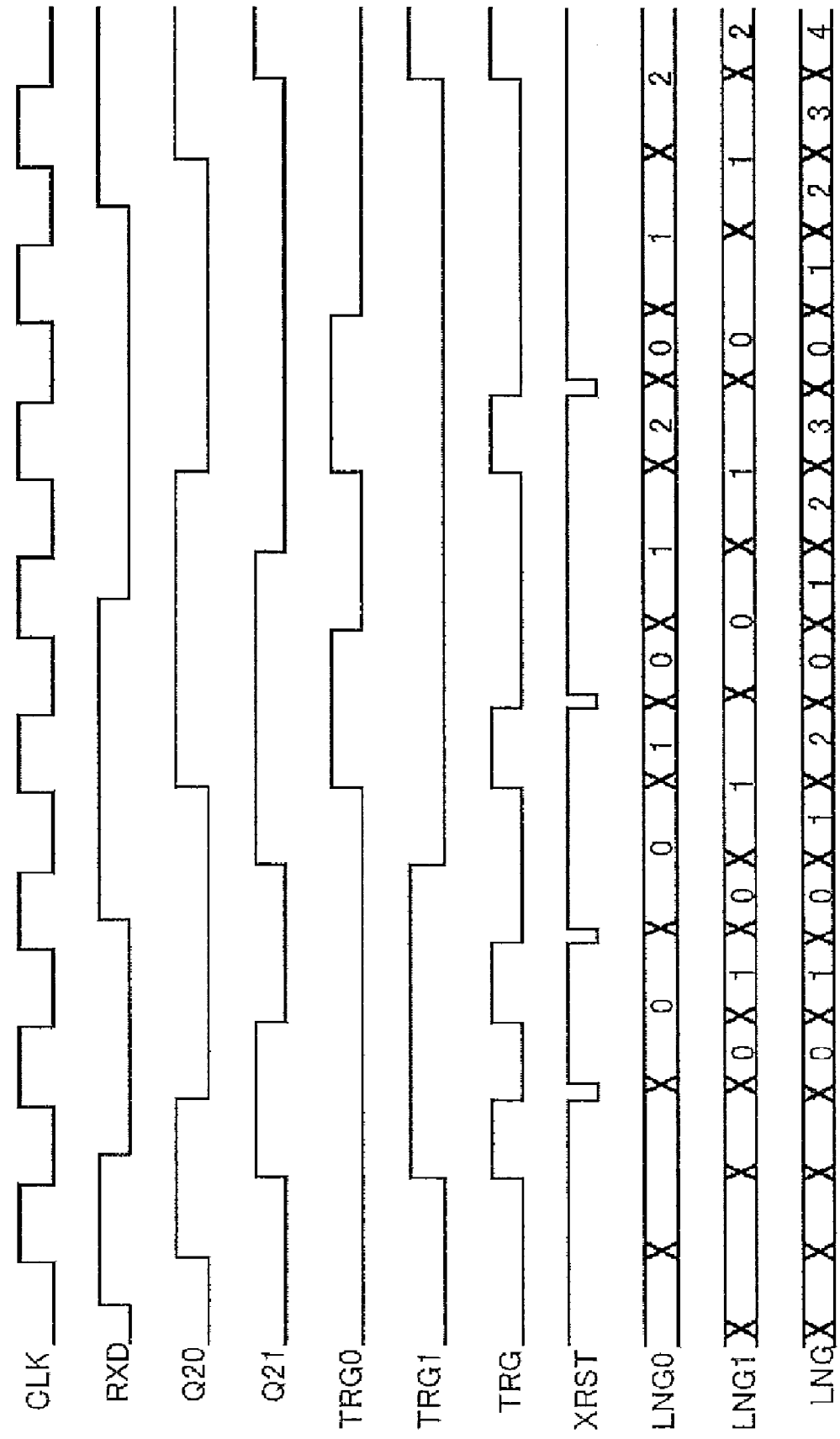

DATA HOLDING CIRCUIT AND SIGNAL PROCESSING CIRCUIT

This Nonprovisional application claims priority under 35 U.S.C. §119(a) on Patent Application 2006-332681 filed in Japan on Dec. 8, 2006, the entire contents of which are hereby incorporated by reference.

BACKGROUND OF THE INVENTION

1. Field of the Invention

The present invention relates to: a data holding circuit capable of latching an input signal at both a rising edge timing and a falling edge timing of a clock signal; and a signal processing circuit used in the data holding circuit for communication and for reading data from a variety of disks.

2. Description of the Related Art

Serial communications capable of transmitting and receiving data at a high speed have been recently used when communications are conducted in a wired or wireless manner. For example, USB (Universal Serial Bus) utilized for connection between a computer and a peripheral device thereof, and Serial ATA (Advanced Technology Attachment) for connection with a hard disk or the like are used for a wired communication. IrDA (Infrared Data Association; infrared communication) or the like is used for a wireless communication. In addition, serial signals in similar serial communications are used for the reading of data from a variety of disks.

Receiving circuits used for the communications described above and reading circuits used for the reading of data from disks generally require a clock signal having a frequency three times or more as high as that for a communication rate or a reading rate. In order to perform the aforementioned processes at a high precision, it is necessary to set a frequency of a reference clock signal as high as possible. However, when a clock signal having a high frequency is used, problems of increasing a current consumption, increasing unnecessary radiation noise and the like occur.

Thus, in order to address these problems, data has been conventionally sampled at both a rising edge timing and a falling edge timing of a clock signal. This corresponds to a case when a clock signal having a frequency twice as high is used. As such, a clock signal having the same frequency as conventional has been used in order to improve the precision of processes, and a clock signal having a frequency that is one-half of a conventional frequency has been used in order to reduce a current consumption and unnecessary radiation noise at a precision equivalent to the conventional.

[Reference 1] Japanese Laid-Open Publication No. 4-105415

SUMMARY OF THE INVENTION

However, the conventional technique described above has the following problems.

When signals that are sampled respectively at both a rising edge timing and a falling edge timing of a clock signal are combined, glitch noise is generated due to a variation of delay times of the signals (signals sampled at the rising edge timing and signals sampled at the falling edge timing). Conventionally, a delay circuit, and an OR circuit and/or an AND circuit have been combined, and an OR operation and/or an AND operation with the clock signal and another signal have been performed so as to remove the glitch noise.

For example, when a conventional signal selection circuit disclosed in Reference 1 selects one signal among an original oscillation clock signal (reference clock signal) and a frequency-divided clock signals obtained by frequency-dividing the original oscillation clock signal, a problem of generating glitch noise at a signal switching timing occurs. Thus, conventionally, a selected signal is altered at a timing so that glitch noise does not occur, or the like.

However, it is difficult to find out at which timing and/or in which signal glitch noise is generated. In addition, a timing of the occurrence of glitch noise and a signal having glitch noise to be generated therein are changed at every design change. Thus, for each design change, it is necessary to find out a timing of the occurrence of glitch noise and/or a signal having glitch noise to be generated therein. Further, it is necessary to adjust a delay time by a delay circuit. Still further, when a clock signal is input into a logic circuit, a problem occurs of having the difficulty to set a timing when a layout of the logic circuit is designed.

The present invention is intended to solve the problems described above. The objective of the present invention is to provide: a data holding circuit that is easily designed and capable of latching an input signal at both a rising edge timing and a falling edge timing of a clock signal, without generating glitch noise; and a signal processing circuit (e.g., receiving circuit, data reading circuit and the like) capable of, by using the data holding circuit, improving the precision of a process using a clock signal having the same frequency as conventional and reducing a current consumption and unnecessary radiation noise at a precision equivalent to the conventional using a clock signal having a frequency that is one-half of a conventional frequency.

A data holding circuit according to the present invention includes: two flip-flops and four exclusive OR circuits, wherein input ends of a first exclusive OR circuit receive an input signal and an output signal from a fourth exclusive OR circuit, respectively, input ends of a second exclusive circuit receive an output signal from the first exclusive OR circuit and an output signal from a first flip-flip, respectively, input ends of a third exclusive OR circuit receive the output signal from the first exclusive OR circuit and an output signal from a second flip-flop, respectively; an input terminal (or data input end) of the first flip-flop receives an output signal from the second exclusive OR circuit and a clock terminal (or clock input end) of the first flip-flop receives a clock signal, and the first flip-flop outputs input data that is input to the input terminal thereof from an output terminal (or data output end) thereof at a rising edge timing of the clock signal while holding the input data therein; an input terminal (or data input end) of the second flip-flop receives an output signal from the third exclusive OR circuit, a clock terminal (or clock input end) of the second flip-flop receives an inverted signal of the clock signal, and the second flip-flop outputs input data that is input to the input terminal thereof from an output terminal (or data output end) thereof at a falling edge timing of the clock signal while holding the input data therein, and input ends of the fourth exclusive OR circuit receive the output signals from the first flip-flop and the second flip-flop, respectively, an output signal from the fourth exclusive OR circuit is output as an output result, and the input signal is latched at both the rising edge timing and the falling edge timing of the clock signal, thereby the objective described above being achieved.

Preferably, in a data holding circuit according to the present invention, the first flip-flop and the second flip-flop are each provided with an asynchronous reset terminal, and a reset signal is input to each of the reset terminals of the respective first flip-flop and second flip-flop, so that a final output signal can be reset to '0' by the reset signal.

Still preferably, in a data holding circuit according to the present invention, the first flip-flop and the second flip-flop are each provided with an asynchronous set terminal, and a reset signal is input to each of the set terminals of the respective first flip-flop and second flip-flop, so that a final output signal can be reset to '0' by the reset signal.

Still preferably, in a data holding circuit according to the present invention, the first flip-flop is provided with an asynchronous set terminal, the second flip-flop is provided with an asynchronous reset terminal, and a set signal is input to the set terminal of the first flip-flop and the reset terminal of the second flip-flop, so that a final output signal can be set to '1' by the set signal.

Still preferably, in a data holding circuit according to the present invention, the first flip-flop is provided with an asynchronous reset terminal, the second flip-flop is provided with an asynchronous set terminal, and a set signal is input to the reset terminal of the first flip-flop and the set terminal of the second flip-flop, so that a final output signal can be set to '1' by the set signal.

Still preferably, in a data holding circuit according to the present invention, the first flip-flop is provided with an asynchronous reset terminal and an asynchronous set terminal, the second flip-flop is provided with an asynchronous reset terminal, a reset signal is input to the reset terminal of the first flip-flop, a set signal is input to the set terminal of the first flip-flop, and a signal obtained as a result of an AND operation with the reset signal and the set signal is input to the reset terminal of the second flip-flop, so that a final output signal can be reset to '0' by the reset signal and the final output signal can be set to '1' by the set signal.

Still preferably, in a data holding circuit according to the present invention, the first flip-flop is provided with an asynchronous reset terminal, the second flip-flop is provided with an asynchronous reset terminal and an asynchronous set terminal, a reset signal is input to the reset terminal of the second flip-flop, a set signal is input to the set terminal of the second flip-flop, and a signal obtained as a result of an AND operation with the reset signal and the set signal is input to the reset terminal of the first flip-flop, so that a final output signal can be reset to '0' by the reset signal and the final output signal can be set to '1' by the set signal.

Still preferably, in a data holding circuit according to the present invention, the first flip-flop is provided with an asynchronous reset terminal and an asynchronous set terminal, the second flip-flop is provided with an asynchronous set terminal, a reset signal is input to the set terminal of the first flip-flop, a set signal is input to the reset terminal of the first flip-flop, and a signal obtained as a result of an AND operation with the reset signal and the set signal is input to the set terminal of the second flip-flop, so that a final output signal can be reset to '1' by the reset signal and the final output signal can be set to '1' by the set signal.

Still preferably, in a data holding circuit according to the present invention, the first flip-flop is provided with an asynchronous set terminal, the second flip-flop is provided with an asynchronous reset terminal and an asynchronous set terminal, a reset signal is input to the set terminal of the second flip-flop, a set signal is input to the reset terminal of the second flip-flop, and a signal obtained as a result of an AND operation with the reset signal and the set signal is input to the set terminal of the first flip-flop, so that a final output signal can be reset to '0' by the reset signal and the final output signal can be set to '1' by the set signal.

Still preferably, in a data holding circuit according to the present invention, the first flip-flop latches an input signal to the first flip-flop at the rising edge timing of the clock signal, and the second flip-flop latches an input signal to the second flip-flop at the falling edge timing of the clock signal.

A signal processing circuit according to the present invention includes: a first flip-flop for outputting input data that is input to a data input terminal thereof from an output terminal thereof at a rising edge timing of a clock signal while holding the input data therein; a second flip-flop for outputting input data that is input to a data input terminal thereof from an output terminal thereof at a falling edge timing of the clock signal while holding the data therein; a combinational circuit for performing a predetermined computation on an output signal from the first flip-flop and an output signal from the second flip-flop; and the data holding circuit according to the present invention described above for receiving a computation result data from the combinational circuit and outputting a change point detection signal, thereby the objective described above being achieved.

A signal processing circuit according to the present invention includes: a first flip-flop for outputting input data that is input to a data input terminal thereof from an output terminal thereof at a rising edge timing of a clock signal while holding the input data therein; a second flip-flop for outputting input data that is input to a data input terminal thereof from an output terminal thereof at a falling edge timing of the clock signal while holding the input data therein; the data holding circuit according to the present invention described above for latching, as an input signal thereto, a signal obtained as a result of an exclusive OR operation with an output signal from the first flip-flop and an output signal from the second flip-flop; one adding circuit for adding 1 to an output signal from the data holding circuit or clear the output signal by setting the output signal to 0 in accordance with a level of the change point detection signal; and a second plurality of data holding circuits according to the present invention described above for each latching a computation result data from the one adding circuit as an input signal thereto, wherein an output signal from each of the second plurality of data holding circuits configures a counter as an input signal to the one adding circuit, so that '0' period or '1' period of the input signal can be counted at every half-clock cycle, thereby the objective described above being achieved.

A signal processing circuit according to the present invention includes: a signal selection output circuit including one or a plurality of frequency-dividing circuits for frequency-dividing an original oscillation clock signal, a selection circuit for selecting a desired clock signal among the original oscillation clock signal and the frequency-divided clock signals, and a signal output circuit for outputting the selected clock signal; and the data holding circuit according to the present invention described above for latching a clock signal from the signal selection output circuit as an input signal thereto, thereby the objective described above being achieved.

Hereinafter, the functions of the present invention having the structures described above will be described.

A data holding circuit according to the present invention includes two flip-flops and four exclusive OR circuits; input ends of the first exclusive OR circuit receive an input signal and an output signal from the fourth exclusive OR circuit, respectively; input ends of the second exclusive circuit receive an output signal from the first exclusive OR circuit and an output signal from the first flip-flip, respectively; input ends of the third exclusive OR circuit receive the output signal from the first exclusive OR circuit and an output signal from the second flip-flop, respectively; an input terminal of the first flip-flop receives an output signal from the second exclusive OR circuit; a clock terminal of the first flip-flop receives a clock signal, and the first flip-flop outputs data that is input to the input terminal thereof from an output terminal thereof at a rising edge timing of the clock signal while holding the input data therein; an input terminal of the second flip-flop receives an output signal from the third exclusive OR circuit, a clock terminal of the second flip-flop receives an inverted signal of the clock signal, and the second flip-flop outputs data that is input to an input terminal thereof from an output terminal thereof at a falling edge timing of the clock signal while holding the input data therein; input ends of the fourth exclusive OR circuit receive the output signals from the first flip-flop and the second flip-flop, respectively; and an output signal from the fourth exclusive OR circuit is output as a final output result (final output signal).

As described above, with a relatively simple structure including two flip-flops and four exclusive OR circuits, it is possible, without generating glitch noise, to latch an input signal at both a rising edge timing (a point of time when a signal changes from '0' to '1'; rising edge) and a falling edge timing (a point of time when a signal change from '1' to '0'; falling edge) of a clock signal. Data is sampled at every clock cycle in a conventional data holding circuit whereas data can be sampled at every half-clock cycle in the data holding circuit according to the present invention. In the data holding circuit according to the present invention, it is possible to easily design a signal processing circuit using both rising and falling edges of a clock signal since no delay circuit is used as conventionally required.

For example, when a conventional signal selection circuit disclosed in Reference 1 selects a plurality of signals that are in synchronization with a rising edge or a falling edge of a clock signal by a selection signal that is also in synchronization with the rising edge or the falling edge of the clock signal, spike noise (glitch noise) that is edge noise is generated at a signal switching timing (change of levels in a signal). However, it is possible to remove the glitch noise using the data holding circuit according to the present invention, by sampling the signal that is selected by the signal selection circuit and that is at a constant value with no glitch noise except at rising and falling edges of the input signal where glitch noise is generated.

Further, by using the data holding circuit according to the present invention for a signal processing circuit to process a serial signal (e.g., receive signal from infrared communication (IrDA) or USB, reading signal from a variety of disks and the like) at a high speed, it is possible to perform a signal detection and/or counting at every half-clock cycle using a clock signal having the same frequency as conventional, thereby improving the precision of a process. In addition, it is possible, by using a clock signal having a frequency that is one-half of a conventional frequency, to perform a process at a precision equivalent to the conventional and to reduce a current consumption and unnecessary radiation noise.

According to a data holding circuit of the present invention, with a relatively simple structure including two flip-flops and four exclusive OR circuits, it is possible, without generating glitch signal, to latch an input signal at both a rising edge timing and a falling edge timing of a clock signal.

In addition, without using a delay circuit as conventionally required, by sampling an input signal using the data holding circuit (latch circuit) according to the present invention, wherein the input signal is at a constant value with no glitch noise except at rising and falling edges of the input signal where glitch noise is generated, it is possible to easily remove the glitch noise from the final output signal.

Further, according to a signal processing circuit using the data holding circuit according to the present invention, it is possible to perform a signal process at every half-clock cycle using a clock signal having the same frequency as conventional, thereby improving the precision of the process. In addition, it is possible, by using a clock signal having a frequency that is one-half of a conventional frequency, to perform a signal process at a precision equivalent to the conventional and to reduce a current consumption and unnecessary radiation noise.

These and other advantages of the present invention will become apparent to those skilled in the art upon reading understanding the following detailed description with reference to the accompanying figures.

BRIEF DESCRIPTION OF THE DRAWINGS

FIG. 13 is a signal waveform diagram of each signal for describing an operation of the conventional receiving circuit shown in FIG. 12.

DESCRIPTION OF THE PREFERRED EMBODIMENTS

Hereinafter, Embodiments 1 to 4 of a data holding circuit according to the present invention and Embodiment 5 of a signal processing circuit according to the present invention using the data holding circuit according to the present invention applied to a receiving circuit will be described in detail with reference to the accompanying drawings.

Embodiment 1

Figure 1:
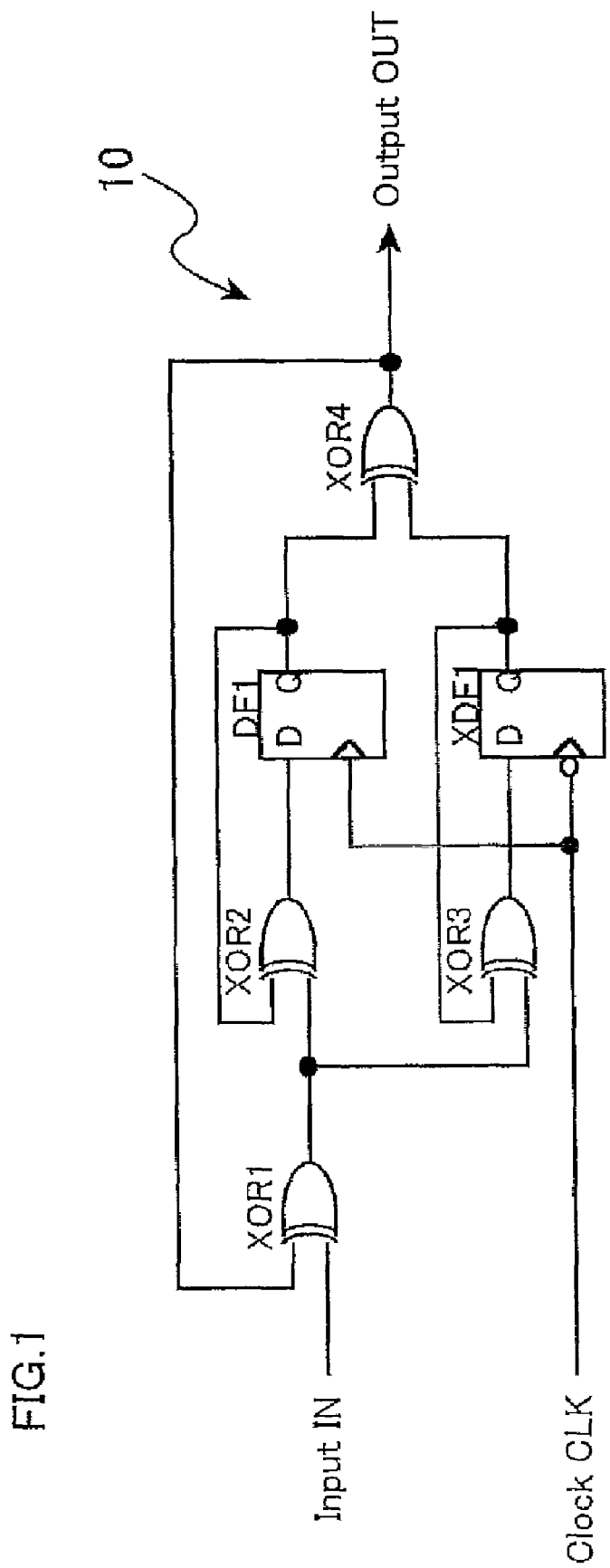
FIG. 1 is a circuit diagram showing an exemplary essential structure of a data holding circuit according to Embodiment 1 of the present invention.

FIG. 1 is a circuit diagram showing an exemplary essential structure of a data holding circuit 10 according to Embodiment 1 of the present invention.

In FIG. 1, the data holding circuit 10 according to Embodiment 1 includes: two flip-flops DF1 and XDF1; and four exclusive OR circuits XOR1 to XOR4 for each outputting a signal of '0' (L level) when it receives the same inputs (e.g., L and L, or the like), and outputting a signal of '1' (H level) when it receives different inputs (e.g., H and L, or the like).

The exclusive OR circuits XOR1 to XOR4 each output a signal of '0' (L level) when it receives the same input signals of '0' or '1', and outputs a signal of '1' (H level) when it receives different input signals of '0' and '1'.

Input ends of the first exclusive OR circuit XOR1 receive an input signal IN and an output signal from the fourth exclusive OR circuit XOR4, respectively. Input ends of the second exclusive OR circuit XOR2 receive an output signal from the first exclusive OR circuit XOR1 and an output signal from the first flip-flop DF1, respectively.

An input terminal D of the first flip-flop DF1 receives an output signal from the second exclusive OR circuit XOR2, and a clock terminal of the first flip-flop DF1 is supplied with a clock signal CLK. Input data from the input terminal D is output from an output terminal Q of the first flip-flop DF1 at a rising edge timing of the clock signal CLK while the data is being held in the first flip-flop DF1.

Input ends of the third exclusive OR circuit XOR3 receive an output signal from the first exclusive OR circuit XOR and an output signal from the second flip-flop XDF1, respectively.

An input terminal D of the second flip-flop XDF1 receives an output signal from the third exclusive OR circuit XOR3, and a clock terminal of the second flip-flop XDF1 is supplied with an inverted signal of the clock signal CLK. Input data from the input terminal D is output from an output terminal Q of the second flip-flop XDF1 at a falling edge timing of the clock signal CLK while the data is being held in the second flip-flop XDF1.

Input ends of the fourth exclusive OR circuit XOR4 receive an output signal from the first flip-flop DF1 and an output signal from the second flip-flop XDF1, respectively. The fourth exclusive OR circuit XOR4 that outputs a signal of L level when it receive the same inputs from the first flip-flop DF1 and the second flip-flop XDF1 outputs an output signal as a final output result (final output signal OUT) from the data holding circuit 10.

Hereinafter, an operation of the data holding circuit 10 according to Embodiment 1 having the structures described above will be described in detail.

Figure 2:
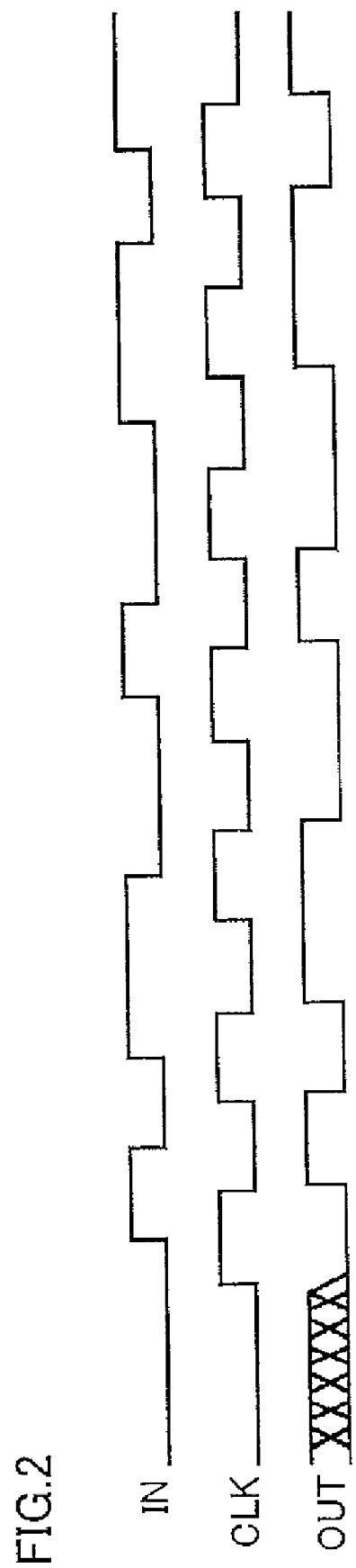
FIG. 2 is a signal waveform diagram of each signal for describing an operation of the data holding circuit shown in FIG. 1.

FIG. 2 is a signal waveform diagram of each signal for describing an operation of the data holding circuit 10 shown in FIG. 1. FIG. 2 shows an input signal IN, a clock signal CLK and a final output result (final output signal OUT).

First, in an initial state, a value of each of the flip-flops DF1 and XDF1 is undetermined since the input signal IN and the clock signal CLK are not input thereto. Thus, the value is neither '0' nor '1'. Therefore, as shown in FIG. 2, the final output signal OUT as a final output result from the data holding circuit 10 is also undetermined. Accordingly, the value of the final output signal OUT is neither '0' nor '1'.

In such a state, when each of the flip-flops DPI and XDF1 is supplied with the clock signal CLK and the input signal IN is input to each of the flip-flops DF1 and XDF1, the first exclusive OR circuit XOR1 receives the input signal IN and outputs an output signal of '1'. The output signal from the first exclusive OR circuit XOR1 is input to each of the second exclusive OR circuit XOR2 and the third exclusive OR circuit XOR3. An output signal from the first flip-flop DF1 and an output signal from the second flip-flip XDF1 are input to the other input ends of the second exclusive OR circuit XOR2 and the third exclusive OR circuit XOR3, respectively. When both output signals are '0' (L level), an output signal from each of the second exclusive OR circuit XOR2 and the third exclusive OR circuit XOR3 becomes '1' (H level).

Next, when the input terminal D of the first flip-flop DF1 receives the output signal of '1' from the second exclusive OR circuit XOR2, the first flip-flop DF1 synchronizes with a rising edge of the pulse of the input clock signal CLK and outputs an output signal of '1'. In this manner, when the output signal from the first flip-flop DF1 becomes '1', an input signal to the other input terminal of the second exclusive OR circuit XOR2 becomes '1', and an output signal from the second exclusive OR circuit XOR2 becomes '0'. In response to this, the first flip-flop DF1 holds the output signal of '1' until a falling edge timing of the pulse of the clock signal CLK for the next sampling, even if the output signal from the second exclusive OR circuit XOR2 becomes '0'. The output signal changes to '0' in accordance with a falling edge of the pulse of the clock signal CLK.

On the other hand, when the input terminal D of the second flip-flop XDF1 receives the output signal of '1' from the third exclusive OR circuit XOR3, the second flip-flop XDF1 synchronizes with a falling edge of the pulse of the input clock signal CLK since the pulse of the clock signal CLK is inverted, and the second flip-flop XDF1 outputs an output signal of '1'. In this manner, when the output signal from the second flip-flop XDF1 becomes '1', an input signal to the other input end of the third exclusive OR circuit XOR3 becomes '1', and an output signal from the third exclusive OR circuit XOR3 becomes '0'. In response to this, the second flip-flop XDF1 holds the output signal of '1', even if the output signal from the third exclusive OR circuit XOR3 becomes '0'. The output signal changes to '0' in accordance with a rising edge of the pulse of the clock signal CLK.

The second exclusive OR circuit XOR2 outputs the output signal of '1' at a rising edge of the pulse of the clock signal CLK. The third exclusive OR circuit XOR3 outputs the output signal of '1' at a falling edge of the pulse of the clock signal CLK. When the second exclusive OR circuit XOR2 outputs the output signal of '1' at a rising edge of the pulse of the clock signal CLK, an output signal (i.e., final output result (final output signal OUT)) from the fourth exclusive OR circuit XOR4 becomes '1', since the output signal from the third exclusive OR circuit XOR3 is '0'. Thereafter, when the third exclusive OR circuit XOR3 outputs the output signal of '1' at a falling edge of the pulse of the clock signal CLK, the output signal (i.e., final output result (final output signal OUT)) from the fourth exclusive OR circuit XOR4 becomes '0'.

Accordingly, when the input signal of '1' is input as the input signal IN at a rising edge or a falling edge of the pulse of the clock signal CLK, the final output result (final output signal OUT) becomes '1' The input signal of '1' as the input signal IN is maintained for rising edges of subsequent pulses of the clock signal CLK, and the final output result (final output signal OUT) is maintained as '1'. After the input signal IN is switched to '0', the input signal IN synchronizes with a rising edge or a falling edge of the pulse of the clock signal CLK, and the final output result (final output signal OUT) changes to '0'

Thus, as shown in FIG. 2, it is possible to sample the input signal IN of '1' or '0' at every half-clock cycle in an assured manner. In addition, it is possible to perform such that the input signal IN of '1' or '0' is output in a correct manner in the case of a pulse signal having a width of a half-clock cycle as well.

In addition, without using a delay circuit as conventionally required, by sampling an input signal IN using the data holding circuit (latch circuit) 10 according to Embodiment 1, wherein the input signal IN is at a constant value with no glitch noise except at rising and falling edges of the input signal IN where glitch noise is generated, it is possible to easily remove the glitch noise from the final output signal OUT.

Embodiment 2

Embodiment 2 will describe a case in which the first flip-flop DF1 and the second flip-flop XDF1 according to Embodiment 1 are each provided with an asynchronous reset terminal R, they are denoted as a first flip-flop DF2 and a second flip-flop XDF2, respectively, and a final output signal OUT can be reset to '0' by a reset signal XR.

Figure 3:
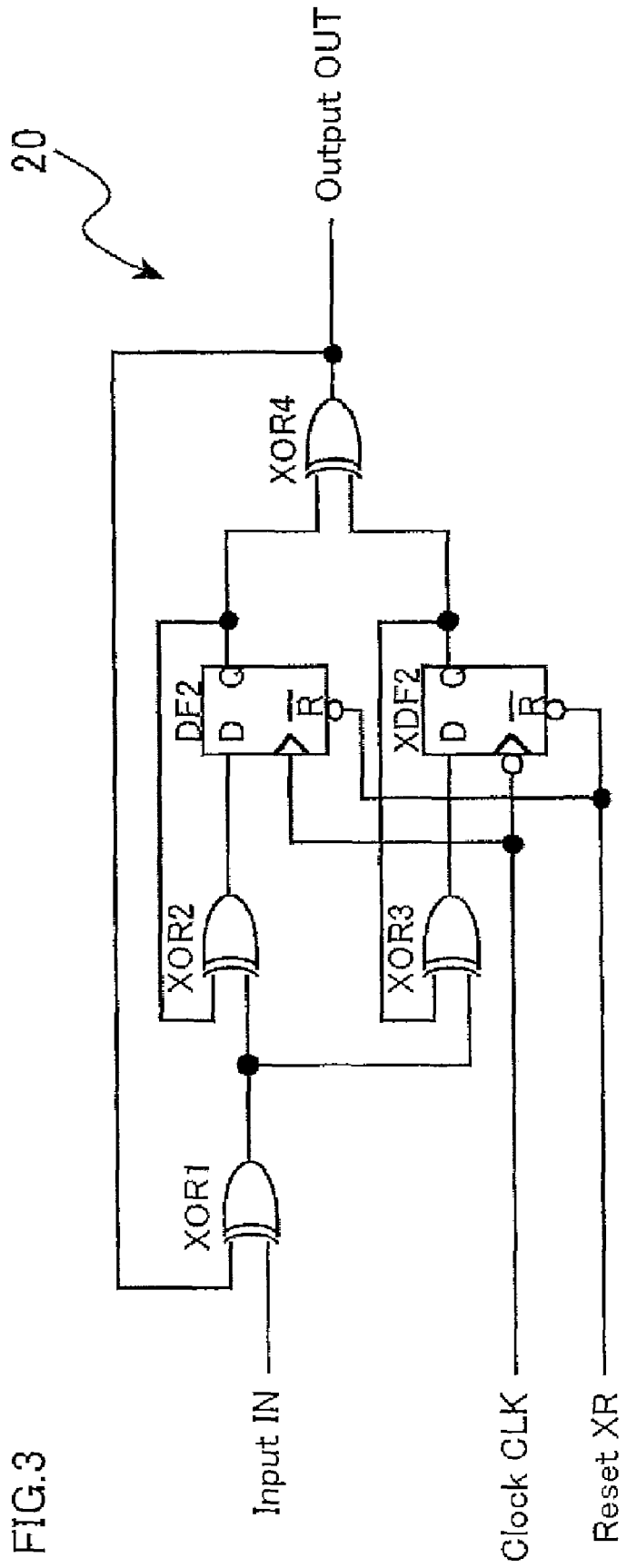
FIG. 3 is a circuit diagram showing an exemplary essential structure of a data holding circuit according to Embodiment 2 of the present invention.

FIG. 3 is a circuit diagram showing an exemplary essential structure of a data holding circuit 20 according to Embodiment 2 of the present invention.

In FIG. 3, the data holding circuit 20 according to Embodiment 2 includes: first and second flip-flops DF2 and XDF2; and four exclusive OR circuits XOR1 to XOR4.

An asynchronous reset terminal R is provided to each of the first flip-flop DF2 and the second flip-flop XDF2. The reset terminal R of each of the first flip-flop DF2 and the second flip-flop XDF2 receives a reset signal XR. It should be noted that the other structures in the data holding circuit 20 are similar to those for the data holding circuit 10 shown in FIG. 1.

Hereinafter, an operation of the data holding circuit 20 according to Embodiment 2 having the structures described above will be described.

Figure 4:
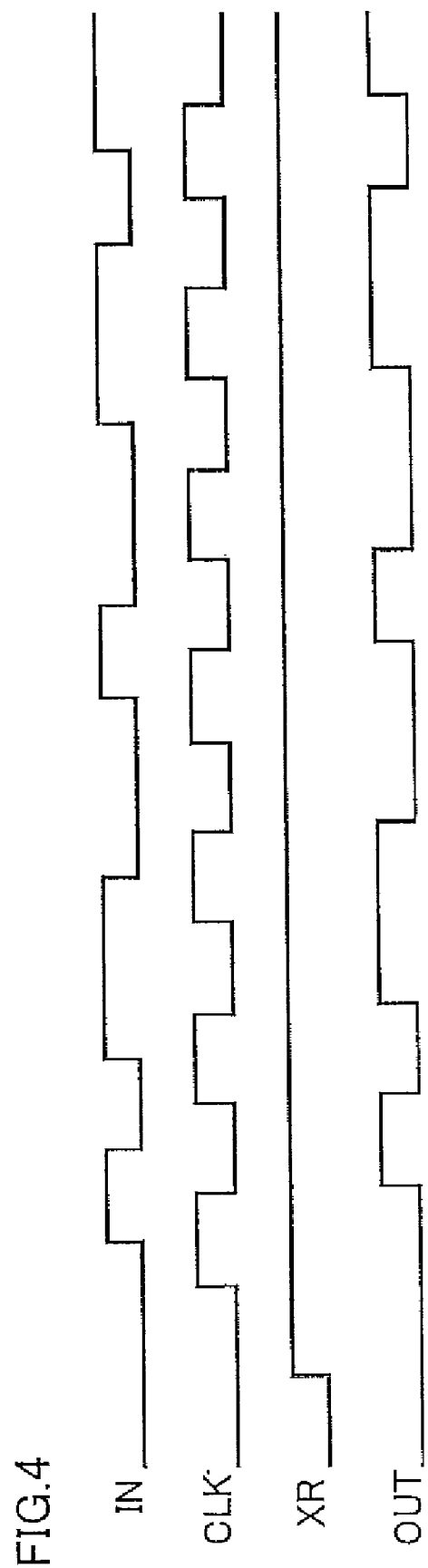
FIG. 4 is a signal waveform diagram of each signal for describing an operation of the data holding circuit shown in FIG. 3.

FIG. 4 is a signal waveform diagram of each signal for describing an operation of the data holding circuit 20 shown in FIG. 3. FIG. 4 shows an input signal IN, a clock signal CLK, a reset signal XR and a final output result (final output signal OUT).

As shown in FIG. 4, in the data holding circuit 20 according to Embodiment 2, the reset signal XR is set to '1'. Thus, when an inverted signal of the reset signal XR is input to a reset terminal R of each of the first flip-flop DF2 and the second flip-flop XDF2, the first flip-flop DF2 and the second flip-flop XDF2 are each placed into a set state. As in the case of the data holding circuit 10 according to Embodiment 1, the value of the input signal IN is output as the final output signal OUT at a first rising edge timing and falling edge timing of the clock signal CLK while the value is being held. [0047] Thus, it is possible to sample the input signal IN of '1' or '0' at every half-clock cycle in an assured manner. In addition, it is possible perform such that the input signal IN of '1' or '0' is output in a correct manner in the case of a pulse signal having a width of a half-clock cycle as well.

In particular, in Embodiment 2, by setting the reset signal XR to '0', it is possible to reset the final output signal OUT to '0' irrespective of the state of the clock signal CLK, since an inverted signal of the reset signal XR is input to the reset terminal R of each of the first flip-flop DF2 and the second flip-flop XDF2. As such, it is possible to set the final output signal OUT, which was unstable in the initial state in FIG. 2, to '0'.

Embodiment 2 have described the case in which the first flip-flop DF2 and the second flip-flop XDF2 in the data holding circuit 20 according to Embodiment 2 are each provided with the asynchronous reset terminal R; the reset terminal R of each of the first flip-flop DF2 and the second flip-flop XDF2 receives the reset signal XR; and the final output signal OUT can be reset to '0' by the reset signal XR. However, the present invention is not limited to this. The first flip-flop DF2 and the second flip-flop XDF2 can be each provided with an asynchronous set terminal S; and the reset signal XR can be input to the set terminal S of each of the first flip-flop DF2 and the second flip-flop XDF2. Also in this case, it is possible to reset the final output signal OUT to '0' by setting the reset signal XR to '0', and it is also possible to set the final output signal OUT, which was unstable in the initial state in FIG. 2, to '0'.

In addition, without using a delay circuit as conventionally required, by sampling an input signal IN using the data holding circuit (latch circuit) 20 according to Embodiment 2, wherein the input signal IN is at a constant value with no glitch noise except at rising and falling edges of the input signal IN where glitch noise is generated, it is possible to easily remove the glitch noise from the final output signal OUT.

Embodiment 3

Embodiment 3 will describe a case in which the first flip-flop DF1 according to Embodiment 1 is provided with an asynchronous set terminal S, and the second flip-flop XDF1 according to Embodiment 1 is provided with an asynchronous reset terminal R, they are denoted as a first flip-flop DF3 and a second flip-flop XDF3, respectively, and a final output signal OUT can be set to '1' by a set signal XS.

Figure 5:
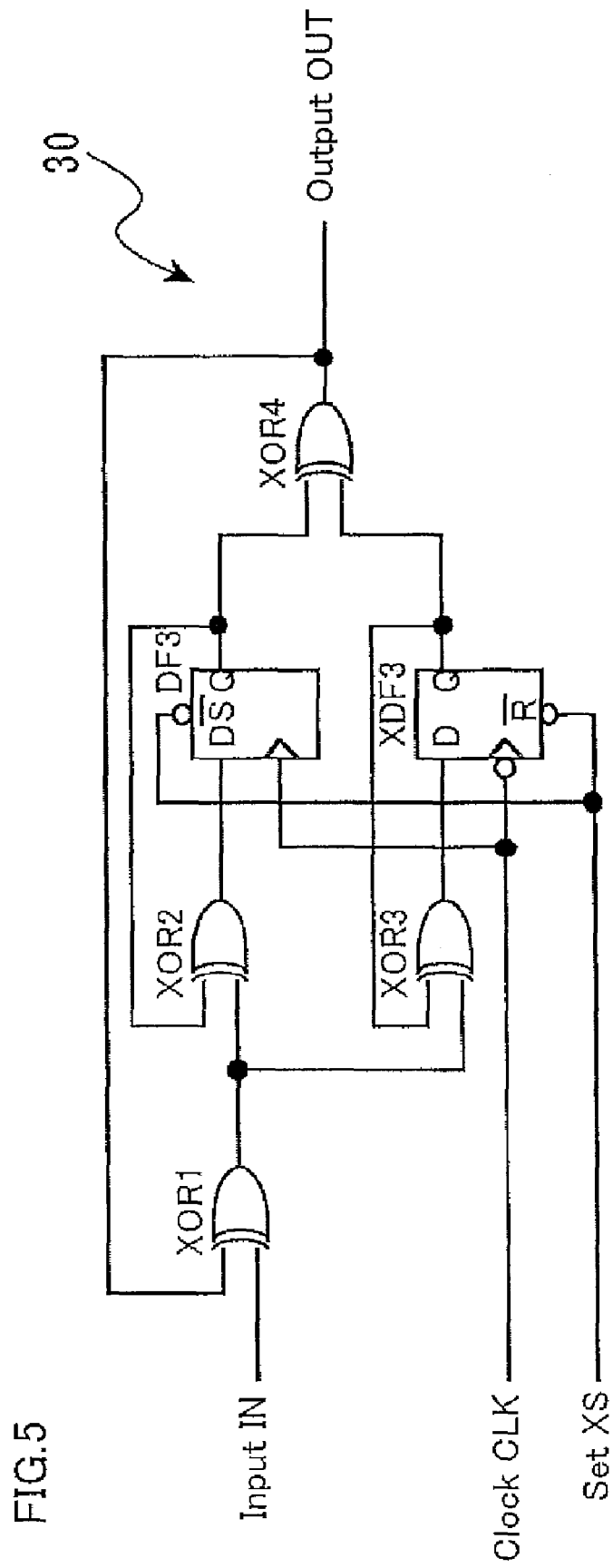
FIG. 5 is a circuit diagram showing an exemplary essential structure of a data holding circuit according to Embodiment 3 of the present invention.

FIG. 5 is a circuit diagram showing an exemplary essential structure of a data holding circuit 30 according to Embodiment 3 of the present invention.

In FIG. 5, the data holding circuit 30 according to Embodiment 3 includes: first and second flip-flops DF3 and XDF3; and four exclusive OR circuits XOR1 to XOR4.

The first flip-flop DF3 is provided with an asynchronous set terminal S, and the second flip-flop XDF3 is provided with an asynchronous reset terminal R. A set signal XS is input to each of the set terminal S of the first flip-flop DF3 and the reset terminal R of the second flip-flop XDF3. [0051] It should be noted that the other structures in the data holding circuit 30 are similar to those for the data holding circuit 10 shown in FIG. 1.

Hereinafter, an operation of the data holding circuit 30 according to Embodiment 3 having the structures described above will be described.

Figure 6:
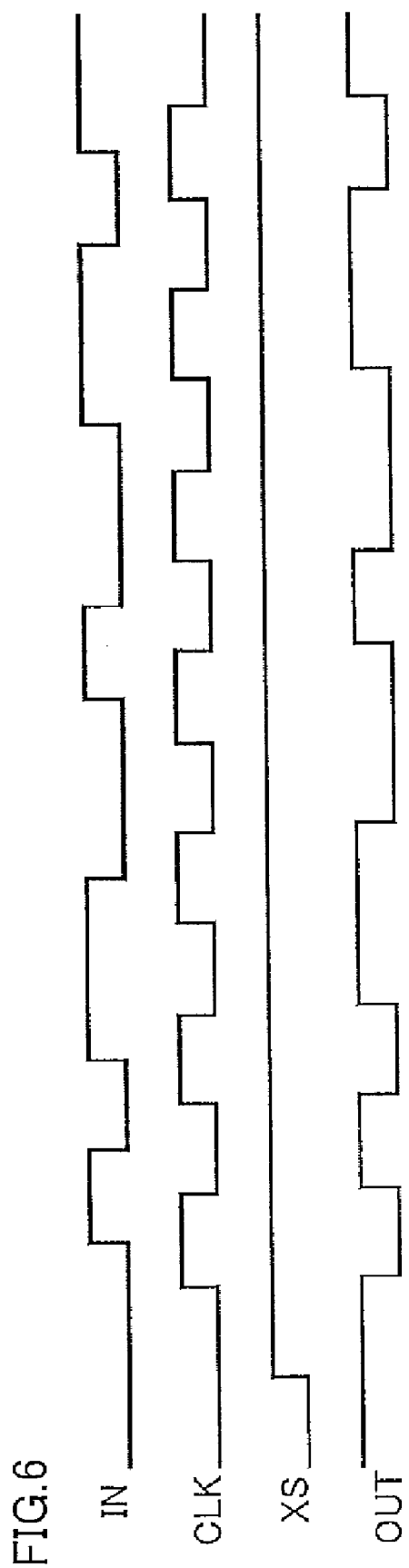
FIG. 6 is a signal waveform diagram of each signal for describing an operation of the data holding circuit shown in FIG. 5.

FIG. 6 is a signal wave form diagram of each signal for describing an operation of the data holding circuit 30 shown in FIG. 5. FIG. 6 shows an input signal IN, a clock signal CLK, a set signal XS and a final output signal OUT.

As shown in FIG. 6, in the data holding circuit 30 according to Embodiment 3, the set signal XS is set to '1'. Thus, when an inverted signal of the set signal XS is input to the set terminal S of the first flip-flop DF3 and the reset terminal R of the second flip-flop XDF3, the first flip-flop DF3 and the second flip-flop XDF3 are each placed into a set state. As in the case of the data holding circuit 10 according to Embodiment 1, the value of the input signal IN is output as the final output signal OUT at a first rising edge timing and falling edge timing of the clock signal CLK while the value is being held. Thus, it is possible to sample the input signal IN of '1' or '1' at every half-clock cycle in an assured manner. In addition, it is possible to perform such that the input signal IN of '1' or '0' is output in a correct manner in the case of a pulse signal having a width of a half-clock cycle as well.

In particular, in Embodiment 3, by setting the set signal XS to '0', it is possible to set the final output signal OUT to '1' irrespective of the state of the clock signal CLK, since an inverted signal of the set signal XS is input to the set terminal S of the first flip-flop DF3 and the reset terminal R of the second flip-flop XDF3. As such, it is possible to set the final output signal OUT, which was unstable in the initial state in FIG. 2, to '1'.

Embodiment 3 have described the case in which the first flip-flop DF3 and the second flip-flop XDF3 in the data holding circuit 30 according to Embodiment 3 are provided with the asynchronous set terminal S and the asynchronous reset terminal R, respectively; the set terminal S and the reset terminal R of the respective first flip-flop DF3 and second flip-flop XDF3 receive the set signal XS; and the final output signal OUT can be set to '1' by the set signal XS. However, the present invention is not limited to this. The first flip-flop DF3 can be provided with an asynchronous reset terminal R; the second flip-flop XDF3 can be provided with an asynchronous set terminal S; and the set signal XS can be input to the reset terminal R of the first flip-flop DF3 and the set terminal S of the second flip-flop XDF3. Also in this case, it is possible to set a final output signal OUT to '1' by the set signal XS, and it is also possible to set the final output signal OUT, which was unstable in the initial state in FIG. 2, to '0'.

In addition, without using a delay circuit as conventionally required, by sampling an input signal IN using the data holding circuit (latch circuit) 30 according to Embodiment 3, wherein the input signal IN is at a constant value with no glitch noise except at rising and falling edges of the input signal IN where glitch noise is generated, it is possible to easily remove the glitch noise from the final output signal OUT.

Embodiment 4

Embodiment 4 will describe a case in which the first flip-flop DF1 according to Embodiment 1 is provided with an asynchronous set terminal S and an asynchronous reset terminal R, and the second flip-flop XDF1 according to Embodiment 1 is provided with an asynchronous reset terminal R, they are denoted as a first flip-flop DF4 and a second flip-flop XDF4, respectively, and a final output signal OUT can be set to '0' by a reset signal XR and the final output signal OUT can be set to '1' by a set signal XS.

Figure 7:
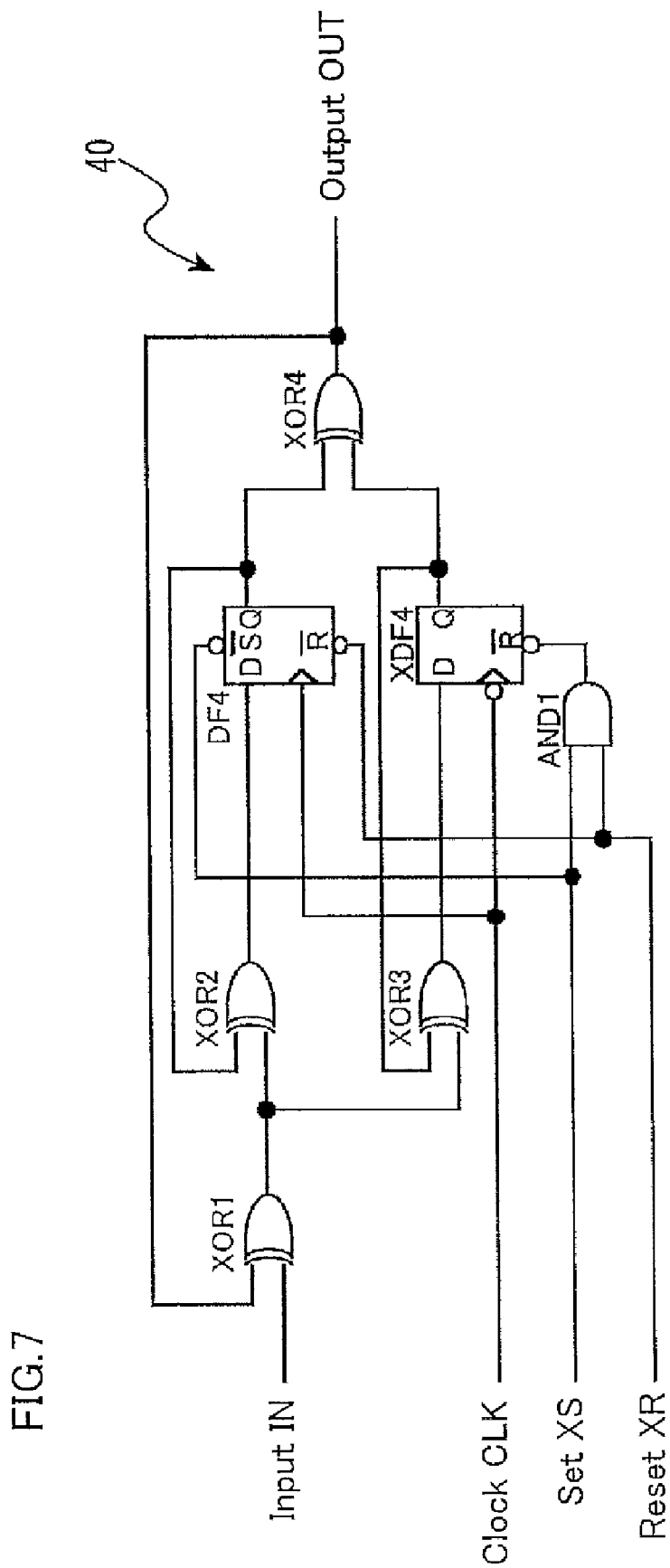
FIG. 7 is a circuit diagram showing an exemplary essential structure of a data holding circuit according to Embodiment 4 of the present invention.

FIG. 7 is a circuit diagram showing an exemplary essential structure of a data holding circuit 40 according to Embodiment 4 of the present invention.

In FIG. 7, the data holding circuit 40 according to Embodiment 4 includes: first and second flip-flops DF4 and XDF4; four exclusive OR circuits XOR1 to XOR4; and one AND circuit AND1.

The first flip-flop DF4 is provided with an asynchronous reset terminal R and an asynchronous set terminals, and the reset terminal R of the first flip-flop DF4 receives a reset signal XR, and the set terminal S of the first flip-flop DF4 receives a set signal XS. In addition, the second flip-flop XDF4 is provided with an asynchronous reset terminal R. The AND circuit AND1 performs an AND operation with the reset signal XR and the set signal XS. An output signal obtained as a result of the AND operation is input to the reset terminal R of the second flip-flop XDF4. It should be noted that the other structures in the data holding circuit 40 are similar to those for the data holding circuit 10 shown in FIG. 1.

Hereinafter, an operation of the data holding circuit 40 according to Embodiment 4 having the structures described above will be described.

Figure 8:
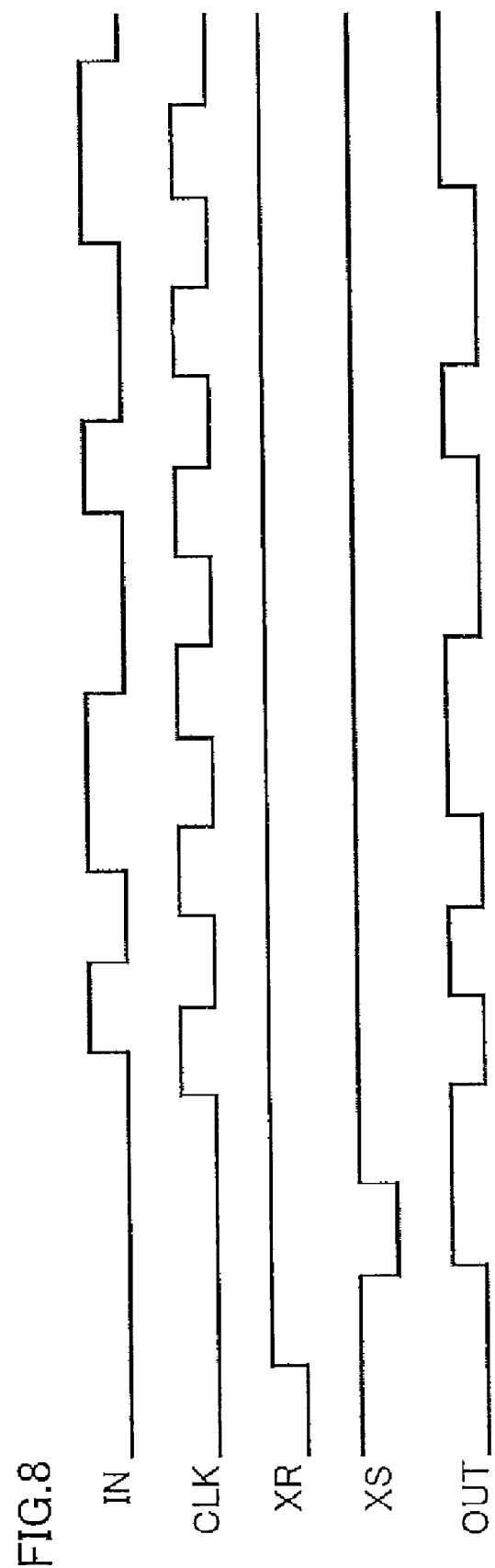
FIG. 8 is a signal wave form diagram of each signal for describing an operation of the data holding circuit shown in FIG. 7.

FIG. 8 is a signal waveform diagram of each signal for describing an operation of the data holding circuit 40 shown in FIG. 7. FIG. 8 shows an input signal IN, a clock signal CLK, a reset signal XR, a set signal XS and a final output signal OUT.

As shown in FIG. 8, according to the data holding circuit 40 of Embodiment 4, it is possible to set the final output signal OUT to '0' irrespective of the state of the clock signal CLK by setting the reset signal XR to '0'. Thus, it is possible to set the final output signal OUT, which was unstable in the initial state in FIG. 2, to '0'. In addition, it is possible to set the final output signal OUT to '1' irrespective of the state of the clock signal CLK by setting the set signal XS to '0'. Thus, it is possible to set the final output signal OUT, which was unstable in the initial state in FIG. 2, to '1'.

As in the case shown in FIG. 2, the value of the input signal IN is output as the final output signal OUT at a first rising edge timing and falling edge timing of the clock signal CLK while the value is being held. Further, as in the case in FIG. 2, it is possible to sample the input signal IN of '1' or '0' at every half-clock cycle in an assured manner. In addition, it is possible to perform such that the input signal IN of '1' or '0' is output in a correct manner in the case of a pulse signal having a width of a half-clock cycle as well.

Embodiment 4 have described the case in which the first flip-flop DF4 and the second flip-flop XDF4 in the data holding circuit 40 according to Embodiment 4 are provided with the asynchronous reset terminal R and the asynchronous set terminal S, and the asynchronous reset terminal R, respectively; the reset terminal R of the first flip-flop DF4 receives the reset signal XR; the set terminal S of the first flip-flop DF4 receives the set signal XS; a signal obtained as a result of an AND operation with the reset signal XR and the set signal XS is input to the reset terminal R of the second flip-flop XDF4; and the final output signal OUT can be reset to '0' by the reset signal XR and the final output signal OUT can be set to '1' by the set signal XS. However, the present invention is not limited to this. The first flip-flop DF4 can be provided with an asynchronous reset terminal R; the second flip-flop XDF4 can be provided with an asynchronous reset terminal R and an asynchronous set terminal S; the reset signal XR can be input to the reset terminal R of the second flip-flop XDF4; the set signal XS can be input to the set terminal S of the second flip-flop XDF4; and a signal obtained as a result of an AND operation with the reset signal XR and the set signal XS is input to the reset terminal R of the first flip-flop DF4. Also in this case, it is possible to reset a final output signal OUT to '0' by the reset signal XR, and it is also possible to set the final output signal OUT to '1' by the set signal XS.

In addition, the first flip-flop DF4 and the second flip-flop XDF4 in a data holding circuit other than the data holding circuit 40 according to Embodiment 4 can be provided with an asynchronous reset terminal R and an asynchronous set terminal S, and an asynchronous set terminal S, respectively; the set terminal S of the first flip-flop DF4 can receive an reset signal XR; the reset terminal R of the first flip-flop DF4 can receive a set signal XS; and a signal obtained as a result of an AND operation with the reset signal XR and the set signal XS can be input to the set terminal S of the second flip-flop XDF4. Also in this case, it is possible to reset a final output signal OUT to '0' by the reset signal XR, and it is also possible to set the final output signal OUT to '1' by the set signal XS.

Further, the first flip-flop DF4 and the second flip-flop XDF4 in a data holding circuit other than the data holding circuit 40 according to Embodiment 4 are provided with an asynchronous set terminal S, and an asynchronous reset terminal R and an asynchronous set terminal S, respectively; the set terminal S of the second flip-flop XDF4 can receive a reset signal XR; the reset terminal R of the second flip-flop XDF4 can receive a set signal XS; and a signal obtained as a result of an AND operation with the reset signal XR and the set signal XS can be input to the set terminal S of the first flip-flop DF4. Also in this case, it is possible to reset a final output signal OUT to '0' by the reset signal XR, and it is also possible to set the final output signal OUT to '1' by the set signal XS.

In addition, without using a delay circuit as conventionally required, by sampling an input signal IN using the data holding circuit (latch circuit) 40 according to Embodiment 4, wherein the input signal IN is at a constant value with no glitch noise except at rising and falling edges of the input signal IN where glitch noise is generated, it is possible to easily remove the glitch noise from the final output signal OUT.

Embodiment 5

Embodiment 5 will describe a signal processing circuit using at least one of Embodiments 1 to 4.

Figure 9:
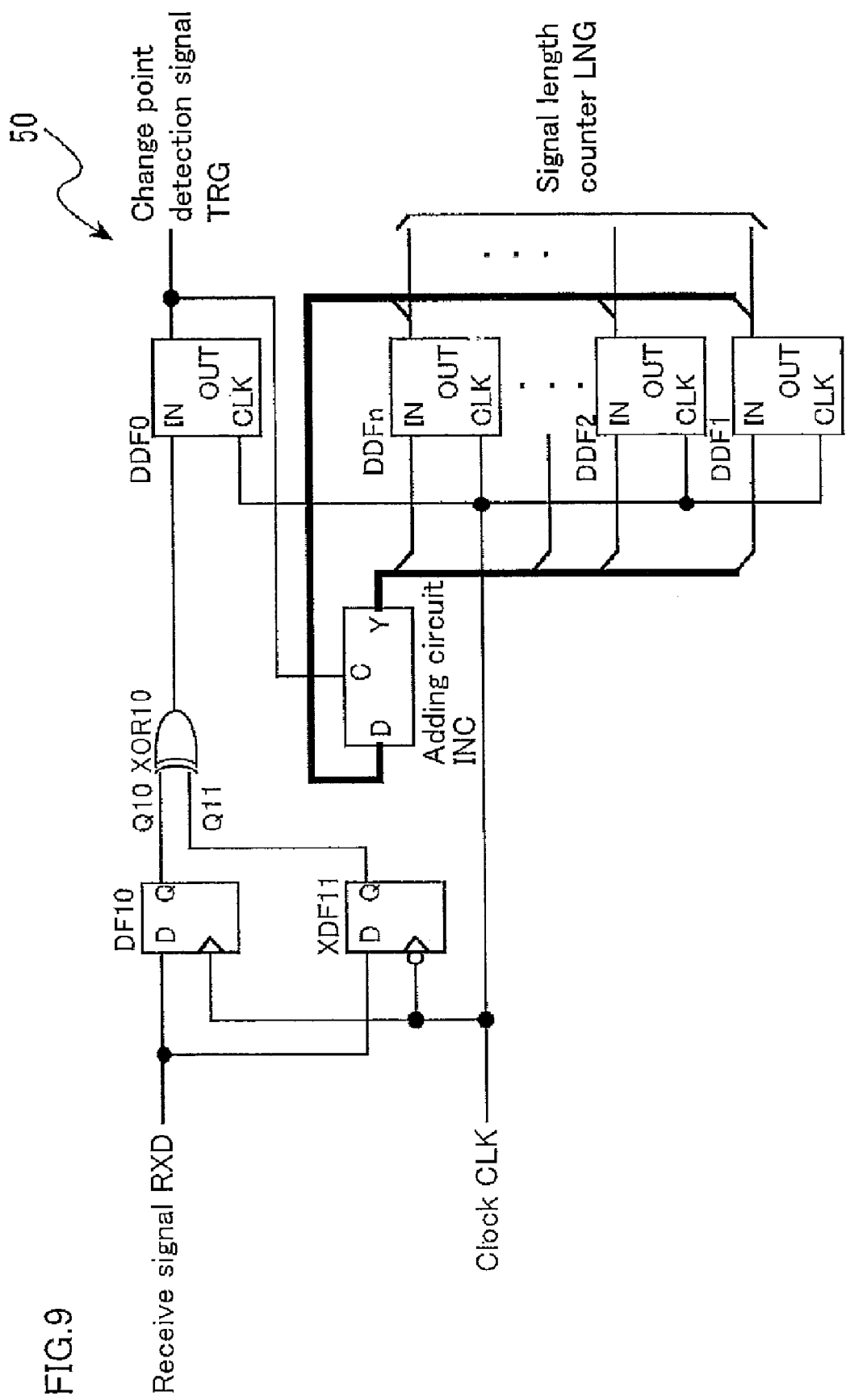
FIG. 9 is a circuit diagram showing an exemplary essential structure of a signal processing circuit according to Embodiment 5 of the present invention applied to a receiving circuit.
Figure 10:
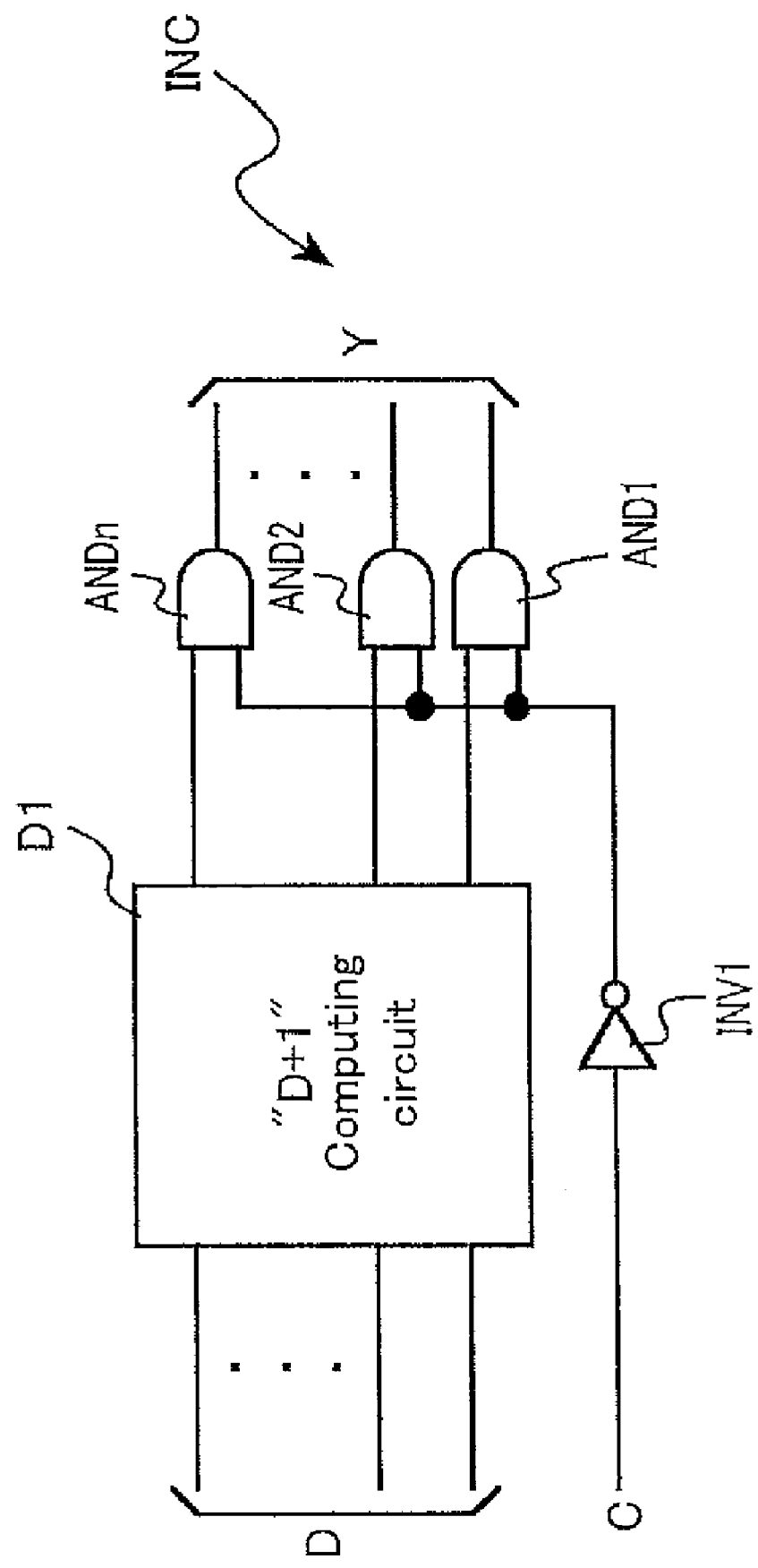
FIG. 10 is a circuit diagram showing an exemplary essential structure of an adding circuit shown in FIG. 9.

FIG. 9 is a circuit diagram showing an exemplary essential structure of a signal processing circuit according to Embodiment 5 of the present invention applied to a receiving circuit 50. FIG. 10 is a circuit diagram showing an exemplary essential structure of an adding circuit INC shown in FIG. 9.

In FIG. 9, the receiving circuit 50 according to Embodiment 5 includes: flip-flops DF10 and XDF11; an exclusive OR circuit XOR10; data holding circuits DDF0, DDF1, DDF2, . . . , DDFn according to the present invention described in any one of Embodiments 1 to 4, and an adding circuit INC. The receiving circuit 50 detects a change point (edge) of '0' to '1' or '1' to '0' in a receive signal RXD, which is received via a serial communication (e.g. USB, Serial ATA) in a wired manner, or via a serial communication (e.g., IrDA (infrared communication) in a wireless manner, and the receiving circuit 50 generates a change point detection signal TRG. In addition, the receiving circuit 50 counts '0' period and/or '1' period of the change point detection signal TRG at every half-clock cycle and generates a value of a signal length counter LNG.

A clock terminal of the flip-flop DF10 is supplied with a clock signal CLK. A receive signal RXD that is input data from an input terminal D of the flip-flop DF10 is output from an output terminal Q thereof at a rising edge timing of the clock signal CLK while the receive signal RXD is being held in the flip-flop DF10.

A clock terminal of the flip-flop DF11 is supplied with an inverted signal of the clock signal CLK. The receive signal RXD that is input data from an input terminal D of the flip-flop DF11 is output from an output terminal Q thereof at a falling edge timing of the clock signal CLK while the receive signal RXD is being held in the flip-flop DF11.

The exclusive OR circuit XOR10 performs an exclusive OR operation with an output signal from the flip-flop DF10 and an output signal from the flip-flop XDF11. The exclusive OR circuit XOR10 outputs a signal of L level when it receives the same inputs, and outputs a signal of H level when it receives different inputs. An output obtained as a result of the exclusive OR operation is input to the data holding circuit DDF0 as the input signal IN.

As described in Embodiments 1 to 4, the data holding circuit DDF0 outputs the value of the input signal IN as a final output signal OUT at a rising edge timing and a falling edge timing of a clock signal CLK while holding the value therein. In addition, the final output signal OUT from the data holding circuit DDF0 is output as the change point detection signal TRG while it is input to a clear terminal C of the adding circuit INC.

As shown in FIG. 10, the adding circuit INC includes: a computing circuit D1; an inverting circuit INV1; and AND circuits AND1 to ANDn.

The computing circuit D1 adds '1' to an input signal D from an input terminal D thereof and outputs 'D+1'.

The inverting circuit INV1 receives a signal from the clear terminal and outputs an inverted signal of the signal.

The AND circuits AND1 to ANDn each perform an AND operation with an output signal from the computing circuit D1 and an output signal from the inverting circuit INV1. The adding circuit INC outputs the output signal 'D+1' from the computing circuit D1 as an output signal Y when a change point detection signal TRG input to the clear terminal C is '0'. An output value from the computing circuit D1 is cleared by setting the output value to '0' when the change point detection signal TRG is '1', and the signal length counter LNG is cleared by setting its value to '0' at the next rising edge timing or the next falling edge timing of the clock signal CLK. Thus, '0' period of the change point detection signal TRG is counted at every half-clock cycle, and a value of the signal length counter LNG is generated.

The computation result Y at the adding circuit INC is input as an input signal IN to each of the data holding circuits DDF1 to DDFn. As described in Embodiments 1 to 4, the data holding circuits DDF1 to DDFn each output the value of the input signal IN as the final output signal OUT at a first rising edge timing or a falling edge timing of a clock signal CLK while holding the value of the input signal IN therein. The final output signal OUT from each of the data holding circuits DDF1 to DDFn is output as a value of the signal length counter LNG while it is input to the input terminal D of the adding circuit INC.

Hereinafter, an operation of the receiving circuit 50 having the structures described above as the signal processing circuit according to Embodiment 5 will be described.

Figure 11:
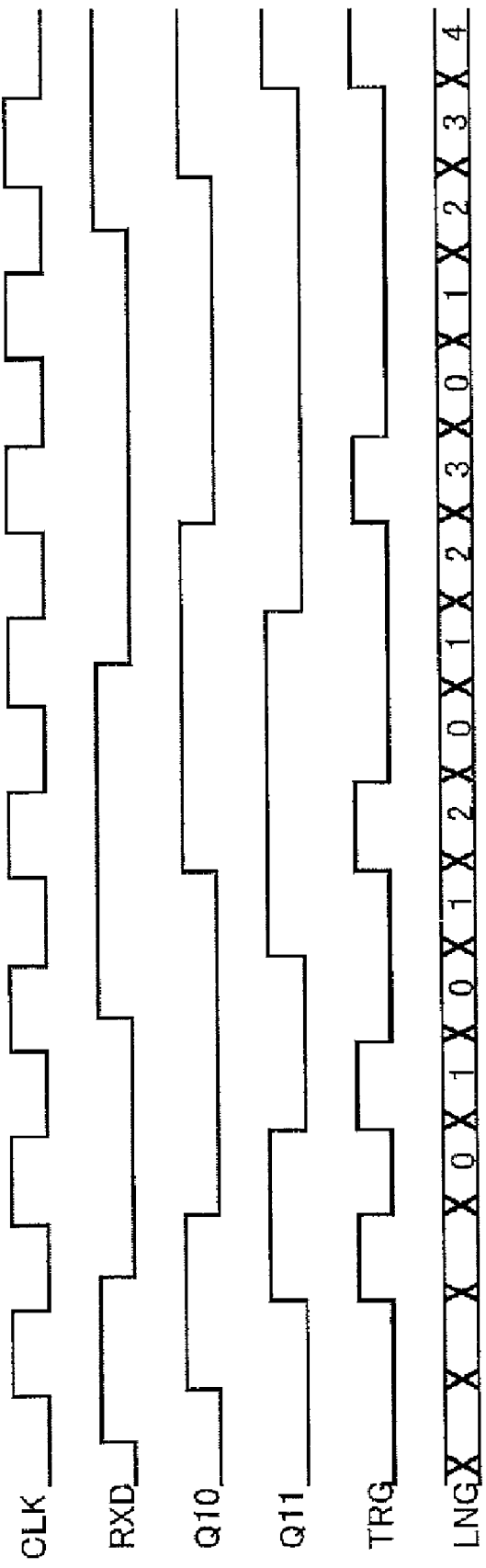
FIG. 11 is a signal waveform diagram of each signal for describing an operation of the receiving circuit shown in FIG. 9.

FIG. 11 is a signal waveform diagram of each signal for describing an operation of the receiving circuit 50 shown in FIG. 9. FIG. 11 shows a clock signal CLK, a receive signal RXD, an output signal Q10 from the flip-flop DF10, an output signal Q11 from the flip-flop XDF11, a change point detection signal TRG and a signal length counter LNG.

First, as shown in FIG. 11, when the receive signal RXD is '0' at a rising edge timing and a falling edge timing of the clock signal CLK, the output signals Q10 and Q11 become '0', and when the receive signal RXD is '1' at a rising edge timing and a falling edge timing of the clock signal CLK, the output signals Q10 and Q11 become '1'.

Next, when a result of an exclusive OR operation with the output signals Q10 and Q11 is '0' at a rising edge timing and a falling edge timing of the clock signal CLK, the change point detection signal TRG becomes '0'. When a result of the exclusive OR operation with the output signals Q10 and Q11 is '1' at a rising edge timing and a falling edge timing of the clock signal CLK, a change point in the receive signal RXD is detected and the change point detection signal TRG becomes '1' for a half-clock cycle.

The value of the signal length counter LNG is incremented by one in the order of '0', '1', '2', . . . at a rising edge timing and a falling edge timing of the clock signal CLK. When the change point detection signal TRG becomes '1', the value of the signal length counter LNG is cleared by setting the value to '0'. In this example, the first '1' period of the receive signal RXD has a length equivalent to 1 clock cycle. Next '0' period has a length equivalent to 1.5 clock cycles. Next '1' period has a length equivalent to 2 clock cycles. Next '0' period has a length equivalent to 2.5 clock cycles. The signal length counter LNG is designed such that the value of the signal length counter LNG is incremented in the order of 1, 2, 3, 4 . . . while the change point detection signal TRG is '1'. As such, the '0' period of the change point detection signal TRG is counted at every half-clock cycle as a value of the signal length counter LNG.

Hereinafter, a comparison between the receiving circuit 50 in FIG. 9 and a receiving circuit that is capable of implementing the functions equivalent to those of the receiving circuit 50 in FIG. 9 with the conventional technique will be discussed in detail with reference to FIG. 12 and FIG. 13 for exemplary reference.

Figure 12:
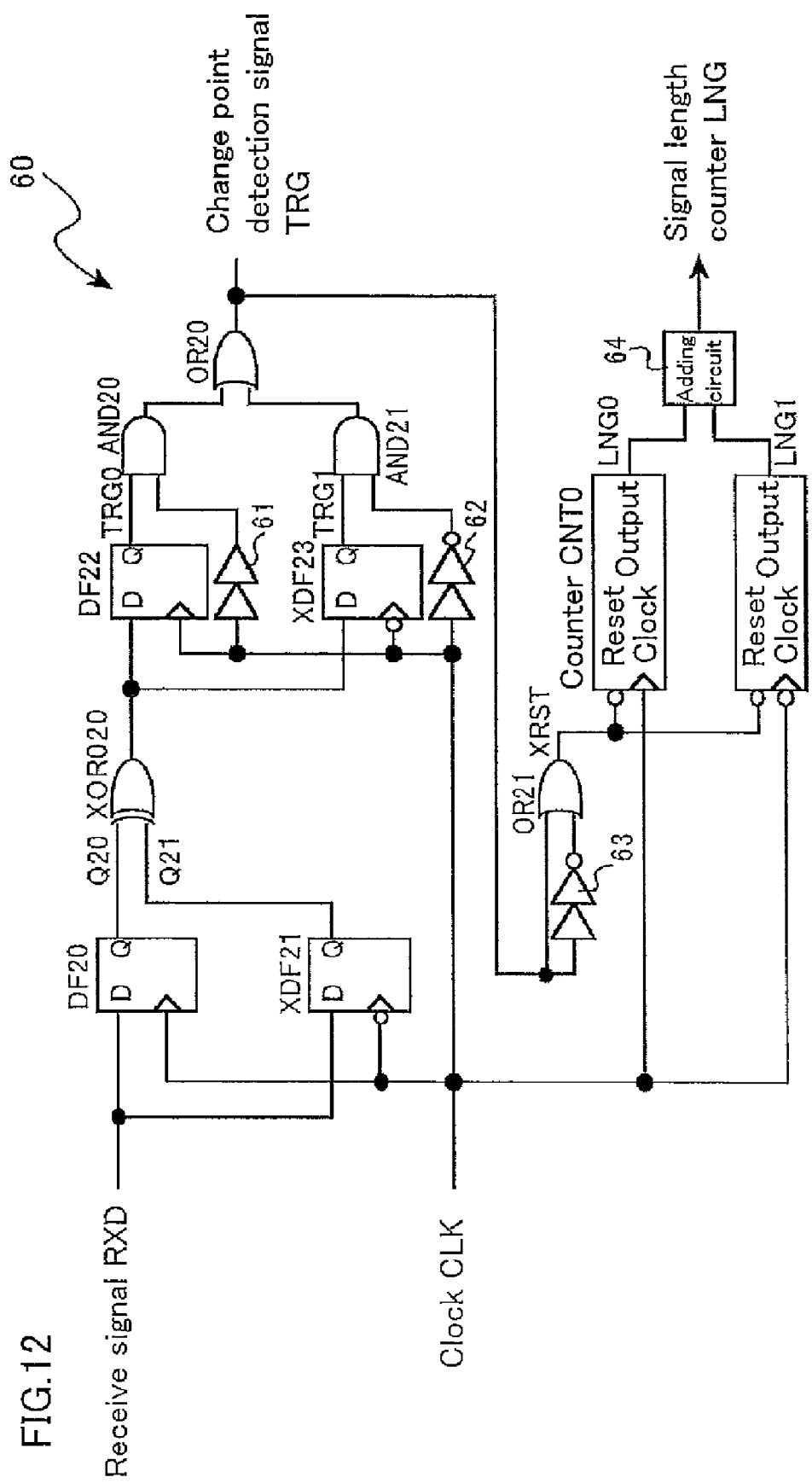
FIG. 12 is a circuit diagram showing exemplary essential structure of a receiving circuit that is capable of implementing the functions equivalent to those of the receiving circuit in FIG. 9 with the conventional technique.

FIG. 12 is a circuit diagram showing exemplary essential structure of a receiving circuit 60 that is capable of implementing the functions equivalent to those of the receiving circuit 50 in FIG. 9 with the conventional technique. It should be noted that a variety of methods for generating the change point detection signal TRG with the conventional technique can be considered, and thus the receiving circuit 60 in FIG. 12 is merely an example.

In FIG. 12, the receiving circuit 60 includes: flip-flops DF20 and XDF21, and DF22 and XDF23; an exclusive OR circuit XOR20; delay circuits 61 to 63; AND circuits AND20 and AND21; OR circuits OR20 and OR21; counters CNT0 and CNT1; and an adding circuit 64.

A clock terminal of the flip-flop DF20 is supplied with a clock signal CLK. A receive signal RXD that is input data from an input terminal D of the flip-flop DF20 is output from an output terminal Q thereof at a rising edge timing of the clock signal CLK while the receive signal RXD is being held in the flip-flop DF20.

A clock terminal of the flip-flop XDF21 is supplied with an inverted signal of the clock signal CLK. The receive signal RXD that is input data from an input terminal D of the f lip-flop XDF21 is output from an output terminal Q thereof at a falling edge timing of the clock signal CLK while the receive signal RXD is being held in the flip-flop XDF21.

The exclusive OR circuit XOR20 performs an exclusive OR operation with an output signal Q20 from the flip-flop DF20 and an output signal Q21 from the flip-flop XDF21.

The flip-flop DF22 outputs an output signal from the exclusive OR circuit XOR20 as an output signal TRG0 at a rising edge timing of a clock signal CLK while holding the output signal TRG0 therein. In addition, the flip-flop XDF23 outputs an output signal from the exclusive OR circuit XOR20 as an output signal TRG1 at a falling edge timing of the clock signal CLK while holding the output signal TRG1 therein.

The AND circuit AND20 performs an AND operation with the output signal TRG0 from the flip-flop DF22 and a delayed signal of the clock signal CLK by the delay circuit 61.

The AND circuit AND21 performs an AND operation with the output signal TRG1 from the flip-flop XDF23 and an inversed delayed signal of the clock signal CLK by the delay circuit 62.

The OR circuit OR20 performs an OR operation with results obtained from the AND operations, and generates a change point detection signal TRG corresponding to a half-clock cycle.

The OR circuit OR21 performs an OR operation with the change point detection signal TRG and an inverted delayed signal of the change point detection signal TRG by the delay circuit 63, and generates a reset signal XRST.

The counter CNT0 increments a value thereof at a rising edge timing of a clock signal CLK. In addition, the counter CNT1 increments a value thereof at a falling edge timing of the clock signal CLK. A reset terminal of each of the counters CNT0 and CNT1 is supplied with a reset signal XRST from the OR circuit OR21. The reset signal XRST is used as an asynchronous reset signal for each of the counters CNT0 and CNT1.

The adding circuit 64 adds output values LNG0 and LNG1 from the respective counters CNT0 and CNT1 so as to generate a value of the signal length counter LNG.

Hereinafter, an operation of the conventional receiving circuit 60 having the structures described above in FIG. 12 will be described.

FIG. 13 is a signal waveform diagram of each signal for describing an operation of the conventional receiving circuit 60. FIG. 13 shows a clock signal CLK, a receive signal RXD, an output signal Q20 from the flip-flop DF20, an output signal Q21 from the flip-flop XDF21, an output signal TRG0 from the flip-flop DF22, an output signal TRG1 from the flip-flop XDF23, an flip-flop change point detection signal TRG, a reset signal XRST, an output value LNG0 from the counter CNT0, an output value LNG1 from the counter CNT1, and a signal length counter LNG.

First, as shown in FIG. 13, when a receive signal RXD is '0' at a rising edge timing and a falling edge timing of a clock signal CLK, output signals Q20 and Q21 from the respective flip-flops DF20 and XDF21 both become '0'. In addition, when a receive signal RXD is '1' at a rising edge timing and a falling edge timing of the clock signal CLK, output signals Q20 and Q21 from the respective flip-flops DF20 and XDF21 both become '1'.

When a result of an exclusive OR operation with the output signals Q20 and Q21 from the respective flip-flops DF20 and XDF21 is '0' at a rising edge timing and a falling edge timing of a clock signal CLK, output signals TRG0 and TRG1 from the respective flip-flops DF22 and XDF23 become '0'. In addition, when a result of an exclusive OR operation with the output signals Q20 and Q21 from the respective flip-flops DF20 and XDF21 is '1' at a rising edge timing and a falling edge timing of a clock signal CLK, output signals TRG0 and TRG1 from the respective flip-flops DF22 and XDF23 become '1'. When one of output signals TRG0 and TRG1 is '1' at a rising edge timing or a falling edge timing of a clock signal CLK, a change point in the receive signal RXD is detected, and a change point detection signal TRG becomes '1' for a half-clock cycle.

A reset signal XRST becomes '1' at a falling edge timing of the change point detection signal TRG after the reset signal XRST becomes '0' once. Counter output values LNG0 and LNG1 are incremented by one in the order of '0', '1', '2', . . . at a rising edge timing and a failing edge timing of a clock signal CLK. The output values LNG0 and LNG1 are cleared by a reset signal XRST which sets the output values LNG0 and LNG1 to '0'. A value of a signal length counter LNG is output from the adding circuit 64 as an added value Ti of the output signals LNG0 and LNG1. Also in this example, the first '1' period of the receive signal RXD has a length equivalent to 1 clock cycle. Next '0' period has a length equivalent to 1.5 clock cycles. Next '1' period has a length equivalent to 2 clock cycles. Next '0' period has a length equivalent to 2.5 clock cycles. The signal length counter LNG is designed such that the value of the signal length counter LNG is incremented in the order of 1, 2, 3, 4 . . . while the change point detection signal TRG is '1'.

The receive circuit 60 for exemplary reference shown in FIG. 12 will have a problem if a delay time by the delay circuits 61 to 63 is too long or too short. Noise glitch is also generated, depending on a variation of delay times.

In contrast thereto, the receive circuit 50 according to Embodiment 5 shown in FIG. 9 does not use a delay circuit at all or does not have to input a clock signal CLK to a combinational circuit. Therefore, it is possible to easily implement a circuit that operates in a stable manner.

In addition, with a substantially equivalent design method for a synchronization circuit only using one of a rising edge timing and a falling edge timing of a clock signal CLK, it is possible to design a circuit using both rising edge timing and falling edge timing of a clock signal CLK, and it is also possible to easily design a circuit with an excellent reliability.

Embodiment 5 has described the case in which the signal processing circuit according to the present invention is applied to the receiving circuit. However, the present invention is not limited to this. The signal processing circuit according to the present invention can be applied to other communication devices and a reading circuit for reading data from a disk.

As described above, the data holding circuit according to the present invention includes two flip-flops and four exclusive OR circuits; input ends of the first exclusive OR circuit receive an input signal IN and an output signal from the fourth exclusive OR circuit, respectively; input ends of the second exclusive circuit receive an output signal from an output signal from the first exclusive OR circuit and an output signal from the first flip-flip, respectively; input ends of the third exclusive OR circuit receive the output signal from the first exclusive OR circuit and an output signal from the second flip-flop, respectively; an input terminal D of the first flip-flop receives an output signal from the second flip-flop, and the first flip-flop outputs input data D at a rising edge timing of a clock signal CLK while holding the input data D therein; an input end D of the second exclusive OR circuit receives an output signal from the third exclusive OR circuit, and the second flip-flop outputs input data D at a falling edge timing of the clock signal CLK while holding the input data D therein; input ends of the fourth exclusive OR circuit receive the output signals from the first flip-flop and the second flip-flop, respectively; and an output signal from the fourth exclusive OR circuit is output as a final output result OUT. As such, it is possible to obtain a data holding circuit that is easily designed and capable of latching an input signal IN at every half-clock cycle using both rising edge timing and falling edge timing of a clock signal CLK without generating glitch noise.

In addition, without using a delay circuit as conventionally required, by sampling an input signal IN using the data holding circuit (latch circuit) according to the present invention, wherein the input signal IN is at a constant value with no glitch noise except at rising and falling edges of the input signal IN where glitch noise is generated, it is possible to easily remove the glitch noise from the final output signal OUT.

As described above, the present invention is exemplified by the use of its preferred Embodiments 1 to 5. However, the present invention should not be interpreted solely based on Embodiments 1 to 5 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 5 of the present invention. Furthermore, it is understood that any patent, any patent application and any references cited in the present specification should be incorporated by reference in the present specification in the same manner as the contents are specifically described therein.

INDUSTRIAL APPLICABILITY

According to the present invention, in the field of: a data holding circuit capable of latching an input signal at both a rising edge timing and a falling edge timing of a clock signal, and a signal processing circuit used in the data holding circuit for communication and for reading data from a variety of disks, with a relatively simple structure including two flip-flops and four exclusive OR circuits, it is possible, without generating glitch signal, to latch an input signal at both a rising edge timing and a falling edge timing of a clock signal.

In addition, without using a delay circuit as conventionally required, by sampling an input signal using the data holding circuit (latch circuit) according to the present invention, wherein the input signal is at a constant value with no glitch noise except at rising and falling edges of the input signal where glitch noise is generated, it is possible to easily remove the glitch noise from the final output signal.

Further, according to a signal processing circuit using the data holding circuit according to the present invention, it is possible to perform a signal process at every half-clock cycle using a clock signal having the same frequency as conventional, thereby improving the precision of the process. In addition, it is possible, by using a clock signal having a frequency that is one-half of a conventional frequency, to perform a signal process at a precision equivalent to the conventional and to reduce a current consumption and unnecessary radiation noise.

What is claimed is:

1. A data holding circuit comprising:
two flip-flops and four exclusive OR circuits,
wherein
input ends of a first exclusive OR circuit receive an input signal and an output signal from a fourth exclusive OR circuit, respectively,
input ends of a second exclusive circuit receive an output signal from the first exclusive OR circuit and an output signal from a first flip-flip, respectively,
input ends of a third exclusive OR circuit receive the output signal from the first exclusive OR circuit and an output signal from a second flip-flop, respectively;
an input terminal of the first flip-flop receives an output signal from the second exclusive OR circuit and a clock terminal of the first flip-flop receives a clock signal, and the first flip-flop outputs input data that is input to the input terminal thereof from an output terminal thereof at a rising edge timing of the clock signal while holding the input data therein;
an input terminal of the second flip-flop receives an output signal from the third exclusive OR circuit, a clock terminal of the second flip-flop receives an inverted signal of the clock signal, and the second flip-flop outputs input data that is input to the input terminal thereof from an output terminal thereof at a falling edge timing of the clock signal while holding the input data therein, and
input ends of the fourth exclusive OR circuit receive the output signals from the first flip-flop and the second flip-flop, respectively, an output signal from the fourth exclusive OR circuit is output as an output result, and the input signal is latched at both the rising edge timing and the falling edge timing of the clock signal.

2. The data holding circuit according to claim 1, wherein the first flip-flop and the second flip-flop are each provided with an asynchronous reset terminal, and a reset signal is input to each of the reset terminals of the respective first flip-flop and second flip-flop, so that a final output signal can be reset to '0' by the reset signal.

3. The data holding circuit according to claim 1, wherein the first flip-flop and the second flip-flop are each provided with an asynchronous set terminal, and a reset signal is input to each of the set terminals of the respective first flip-flop and second flip-flop, so that a final output signal can be reset to '0' by the reset signal.

4. The data holding circuit according to claim 1, wherein the first flip-flop is provided with an asynchronous set terminal, the second flip-flop is provided with an asynchronous reset terminal, and a set signal is input to the set terminal of the first flip-flop and the reset terminal of the second flip-flop, so that a final output signal can be set to '1' by the set signal.

5. The data holding circuit according to claim 1, wherein the first flip-flop is provided with an asynchronous reset terminal, the second flip-flop is provided with an asynchronous set terminal, and a set signal is input to the reset terminal of the first flip-flop and the set terminal of the second flip-flop, so that a final output signal can be set to '1' by the set signal.

6. The data holding circuit according to claim 1, wherein the first flip-flop is provided with an asynchronous reset terminal and an asynchronous set terminal, the second flip-flop is provided with an asynchronous reset terminal, a reset signal is input to the reset terminal of the first flip-flop, a set signal is input to the set terminal of the first flip-flop, and a signal obtained as a result of an AND operation with the reset signal and the set signal is input to the reset terminal of the second flip-flop, so that a final output signal can be reset to '0' by the reset signal and the final output signal can be set to '1' by the set signal.

7. The data holding circuit according to claim 1, wherein the first flip-flop is provided with an asynchronous reset terminal, the second flip-flop is provided with an asynchronous reset terminal and an asynchronous set terminal, a reset signal is input to the reset terminal of the second flip-flop, a set signal is input to the set terminal of the second flip-flop, and a signal obtained as a result of an AND operation with the reset signal and the set signal is input to the reset terminal of the first flip-flop, so that a final output signal can be reset to '0' by the reset signal and the final output signal can be set to '1' by the set signal.

8. The data holding circuit according to claim 1, wherein the first flip-flop is provided with an asynchronous reset terminal and an asynchronous set terminal, the second flip-flop is provided with an asynchronous set terminal, a reset signal is input to the set terminal of the first flip-flop, a set signal is input to the reset terminal of the first flip-flop, and a signal obtained as a result of an AND operation with the reset signal and the set signal is input to the set terminal of the second flip-flop, so that a final output signal can be reset to '0' by the reset signal and the final output signal can be set to '1' by the set signal.

9. The data holding circuit according to claim 1, wherein the first flip-flop is provided with an asynchronous set terminal, the second flip-flop is provided with an asynchronous reset terminal and an asynchronous set terminal, a reset signal is input to the set terminal of the second flip-flop, a set signal is input to the reset terminal of the second flip-flop, and a signal obtained as a result of an AND operation with the reset signal and the set signal is input to the set terminal of the first flip-flop, so that a final output signal can be reset to '0' by the reset signal and the final output signal can be set to '1' by the set signal.

10. The data holding circuit according to claim 1, wherein the first flip-flop latches an input signal to the first flip-flop at the rising edge timing of the clock signal, and the second flip-flop latches an input signal to the second flip-flop at the falling edge timing of the clock signal.

11. A signal processing circuit comprising:
a first flip-flop for outputting input data that is input to a data input terminal thereof from an output terminal thereof at a rising edge timing of a clock signal while holding the input data therein;
a second flip-flop for outputting input data that is input to a data input terminal thereof from an output terminal thereof at a falling edge timing of the clock signal while holding the data therein;
a combinational circuit for performing a predetermined computation on an output signal from the first flip-flop and an output signal from the second flip-flop; and
the data holding circuit according to claim 1 for receiving a computation result data from the combinational circuit and outputting a change point detection signal.

12. A signal processing circuit comprising:
a first flip-flop for outputting input data that is input to a data input terminal thereof from an output terminal thereof at a rising edge timing of a clock signal while holding the input data therein;
a second flip-flop for outputting input data that is input to a data input terminal thereof from an output terminal thereof at a falling edge timing of the clock signal while holding the input data therein;
the data holding circuit according to claim 1 for latching, as an input signal thereto, a signal obtained as a result of an exclusive OR operation with an output signal from the first flip-flop and an output signal from the second flip-flop;
one adding circuit for adding 1 to an output signal from the data holding circuit or clear the output signal by setting the output signal to 0 in accordance with a level of the change point detection signal; and
a second plurality of data holding circuits according to claim 1 for each latching a computation result data from the one adding circuit as an input signal thereto,
wherein
an output signal from each of the second plurality of data holding circuits configures a counter as an input signal to the one adding circuit, so that '0' period or '1' period of the input signal can be counted at every half-clock cycle.

13. A signal processing circuit comprising:
a signal selection output circuit including one or a plurality of frequency-dividing circuits for frequency-dividing an original oscillation clock signal, a selection circuit for selecting a desired clock signal among the original oscillation clock signal and the frequency-divided clock signals, and a signal output circuit for outputting the selected clock signal; and
the data holding circuit according to claim 1 for latching a clock signal from the signal selection output circuit as an input signal thereto.

* * * * *